(12) United States Patent
Tan et al.

(10) Patent No.: US 7,745,897 B2
(45) Date of Patent: Jun. 29, 2010

(54) METHODS FOR PACKAGING AN IMAGE SENSOR AND A PACKAGED IMAGE SENSOR

(75) Inventors: Cheng Why Tan, Penang (MY); Piang Joon Seow, Penang (MY)

(73) Assignee: Aptina Imaging Corporation, Grand Cayman (KY)

( * ) Notice: Subject to any disclaimer, the term of this patent is extended or adjusted under 35 U.S.C. 154(b) by 1433 days.

(21) Appl. No.: 11/140,157

(22) Filed: May 27, 2005

(65) Prior Publication Data

US 2006/0268144 A1    Nov. 30, 2006

(51) Int. Cl.
*H01L 31/0203* (2006.01)
(52) U.S. Cl. .................. 257/433; 257/434; 257/680; 257/704; 257/E31.11
(58) Field of Classification Search .......... 257/291, 257/433, 434, 680, 704, E27.13, E27.136, 257/E27.161, E31.11
See application file for complete search history.

(56) References Cited

U.S. PATENT DOCUMENTS

| | | | |
|---|---|---|---|
| 6,646,289 B1 | 11/2003 | Badehi | |
| 6,737,292 B2 * | 5/2004 | Seo | ............................. 438/64 |
| 6,777,767 B2 | 8/2004 | Badehi | |
| 6,995,462 B2 * | 2/2006 | Bolken et al. | ............... 257/680 |
| 7,087,464 B2 * | 8/2006 | Yu et al. | ..................... 438/113 |
| 2005/0059188 A1 * | 3/2005 | Bolken et al. | ............... 438/106 |
| 2006/0087018 A1 * | 4/2006 | Chao et al. | .................. 257/680 |

* cited by examiner

*Primary Examiner*—Tuan N. Quach
(74) *Attorney, Agent, or Firm*—RatnerPrestia (57) ABSTRACT

An image sensor is packaged by attaching the image sensor to a substrate, forming metallic bumps on either the image sensor or a transparent cover, where the metallic bumps are formed in a pattern around the perimeter of the active area of the image sensor. The transparent cover is then glued to the image sensor at the metallic bumps. Electrical connections are formed between the image sensor and the substrate using, for example, conventional wire bonding techniques. The electrical connections are encapsulated within an epoxy for protection. In an embodiment, multiple image sensors are packaged together on the same substrate and separated into individually packaged image sensors by, for example, sawing.

8 Claims, 10 Drawing Sheets

FIG.1A  Top View

FIG.1B  Side View

Normal Bonding

FIG.4A

Reverse Bonding

FIG.4B

BSOB

METHODS FOR PACKAGING AN IMAGE SENSOR AND A PACKAGED IMAGE SENSOR

BACKGROUND OF THE INVENTION

Image sensors that are used for digital imaging must be packaged to provide electrical connections between the image sensor and a circuit board. Image sensors are sensitive to dust and particulates that can be present during packaging and use. Therefore, image sensor packaging typically includes a transparent cover that is secured over the active area of the image sensor. Conventional techniques for securing a transparent cover over an image sensor include gluing the transparent cover directly to the image sensor and using a transparent cover with crystalline spacers that are formed on the transparent cover using a liquid crystal on substrate (LCOS) process. Although these techniques work well, they require multiple process steps and/or equipment that is not typically used in integrated circuit (IC) packaging processes.

SUMMARY OF THE INVENTION

An image sensor is packaged by attaching the image sensor to a substrate, forming metallic bumps on either the image sensor or a transparent cover, where the metallic bumps are formed in a pattern around the perimeter of the active area of the image sensor. The transparent cover is then glued to the image sensor at the metallic bumps. Electrical connections are formed between the image sensor and the substrate using, for example, conventional wire bonding techniques. The electrical connections are encapsulated within an epoxy for protection. In an embodiment, multiple image sensors are packaged together on the same substrate and separated into individually packaged image sensors by, for example, sawing. Because the packaging technique uses conventional packaging technologies, such as die attach, wire bonding, adhesive dispensing and curing, and singulation, specialized packaging equipment is not necessary.

Other aspects and advantages of the present invention will become apparent from the following detailed description, taken in conjunction with the accompanying drawings, illustrated by way of example of the principles of the invention.

BRIEF DESCRIPTION OF THE DRAWINGS

Throughout the description similar reference numbers may be used to identify similar elements.

DETAILED DESCRIPTION

An image sensor is packaged by attaching the image sensor to a substrate, forming metallic bumps on either the image sensor or a transparent cover, where the metallic bumps are formed in a pattern around the perimeter of the active area of the image sensor. The transparent cover is then glued to the image sensor at the metallic bumps. Electrical connections are formed between the image sensor and the substrate using, for example, conventional wire bonding techniques. The electrical connections are encapsulated within an epoxy for protection. In an embodiment, multiple image sensors are packaged together on the same substrate and separated into individually packaged image sensors by, for example, sawing.

Figure 1A:
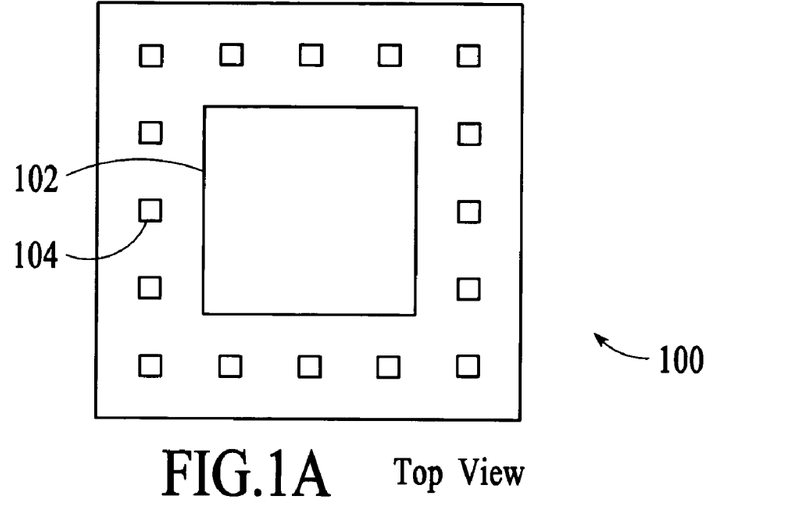
FIGS. 1A and 1B depict top and side views, respectively, of an image sensor.
Figure 1B:
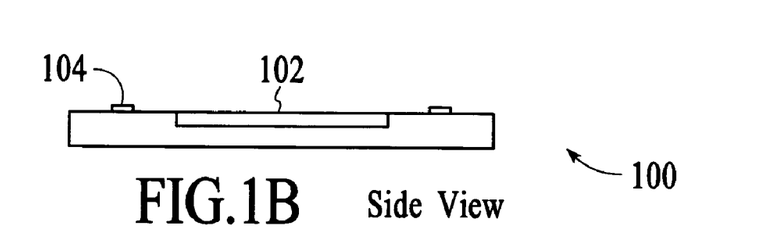

FIGS. 1A and 1B depict top and side views, respectively, of an image sensor 100. The image sensor includes an active area 102 (i.e., a photosensitive area) that captures image information in response to light. The image sensor can be, for example, a complementary metal oxide semiconductor (CMOS) or charged coupled device (CCD) type image sensor. The image sensor includes bond pads 104 for electrically connecting the image sensor to a substrate such as an organic printed circuit board (PCB), a ceramic panel, or a metal lead frame.

Figure 2A:
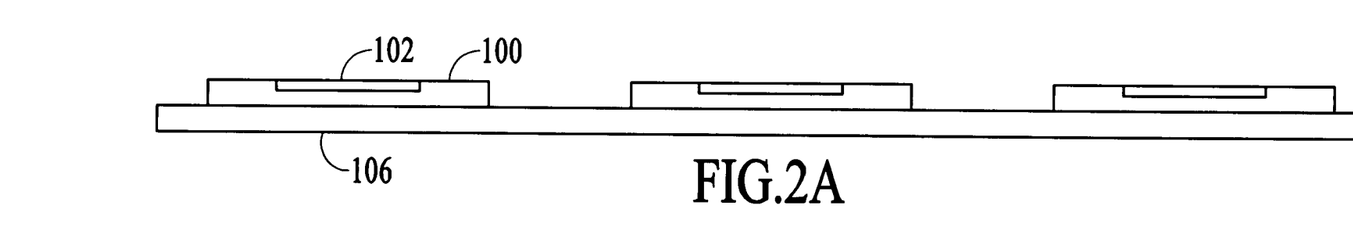
FIGS. 2A-2H depict steps in a method for packaging image sensors in accordance with an embodiment of the invention in which metallic bumps are formed on the image sensor and wire bonding is performed before a transparent cover is attached.

Various alternative embodiments of the packaging process are described below with reference to FIGS. 2A-7H. FIGS. 2A-2H depict steps in a method for packaging image sensors in accordance with an embodiment of the invention in which metallic bumps are formed on the image sensor and wire bonding is performed before a transparent cover is attached. Referring to FIG. 2A, image sensors 100 as described above in FIGS. 1A and 1B are attached to a substrate 106. The substrate is, for example, an organic PCB, a ceramic panel, or a metal leadframe. As depicted in FIG. 2A, more than one image sensor is attached to the same substrate. Attaching multiple ICs to the same substrate is widely used in IC packaging processes to improve efficiency.

Figure 2B:
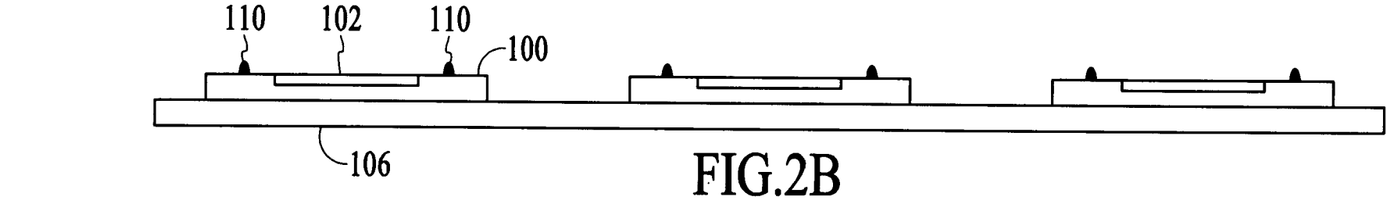
Figure 3:
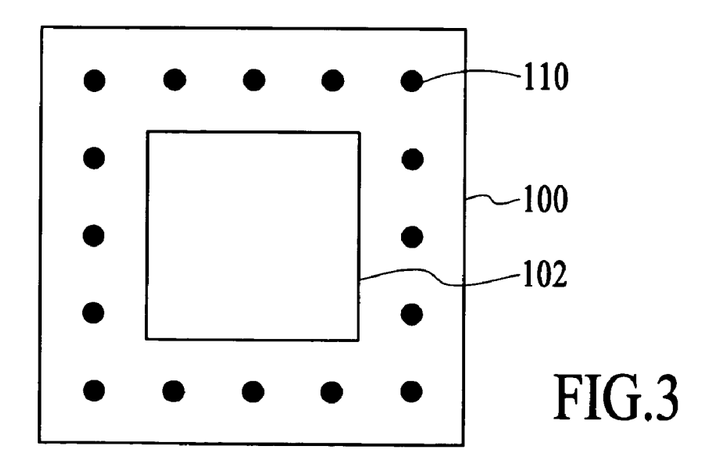
FIG. 3 depicts a top view of an image sensor with an exemplary pattern of metallic bumps formed around the perimeter of the active area.

After the image sensors 100 are attached to the substrate 106, metallic bumps 110 are formed on the image sensors as depicted in FIG. 2B. In an embodiment, the metallic bumps have a uniform height and are formed in a pattern around the perimeter of the active area of the image sensors. FIG. 3 depicts a top view of an image sensor 100 with an exemplary pattern of metallic bumps 110 formed around the perimeter of the active area 102. In the embodiment of FIG. 3, the metallic bumps are formed on the bond pads (FIG. 1A) of the image sensor. The metallic bumps can be formed of gold using wire bonding equipment. In an alternative embodiment, metallic bumps may also be formed on the substrate in the same process step.

Figure 2C:
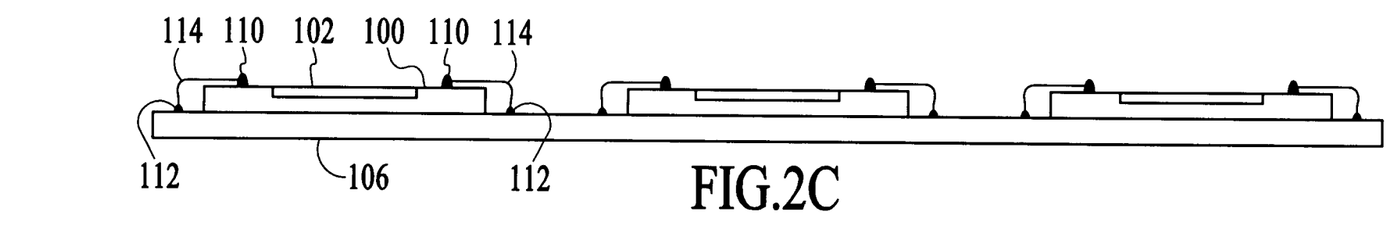
Figure 4A:
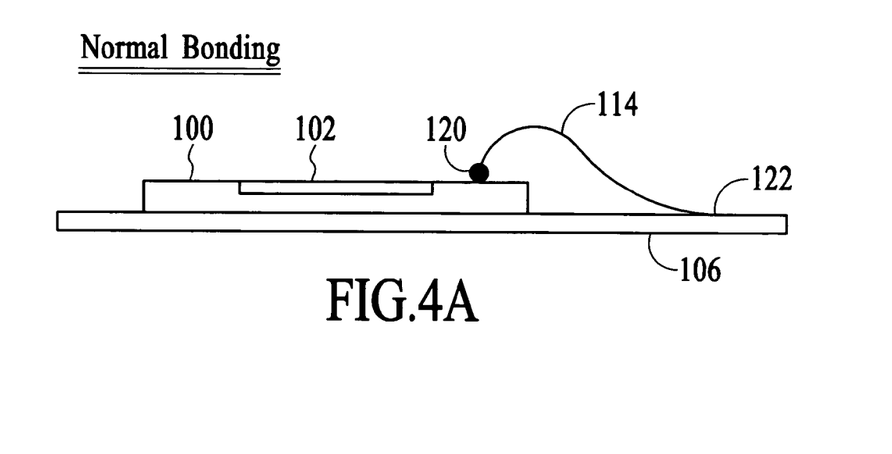
FIG. 4A depicts a "normal" bonding technique in which a ball bond is used at the image sensor and a stitch bond is used at the substrate.
Figure 4B:
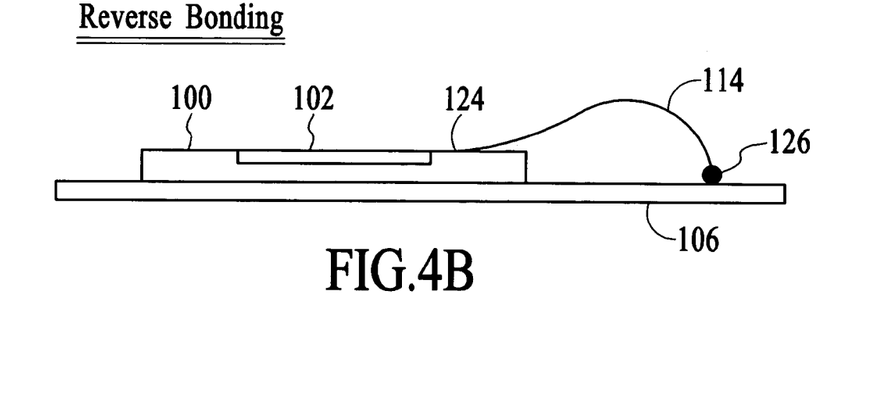
FIG. 4B depicts a "reverse" bonding technique in which a stitch bond is used at the image sensor and a ball bond is used at the substrate.
Figure 4C:
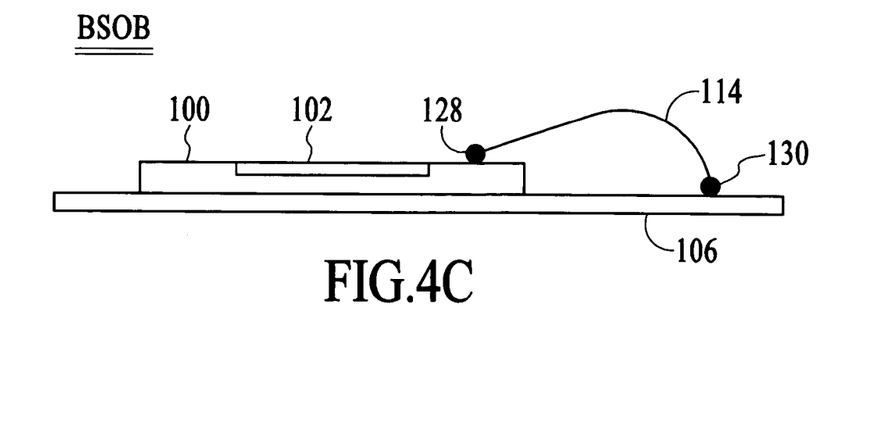
FIG. 4C depicts the ball stitch on ball bonding technique in which ball bonds are used at both the image sensor and the substrate.

Once the metallic bumps 110 are formed on the image sensors 100 and the substrate 106, electrical connections are created between the image sensors and the substrate as depicted in FIG. 2C. In the embodiment of FIG. 2C, the electrical connections are formed via wire bonds 114 that are soldered between the metallic bumps 110 on the image sensors and the substrate. Metallic bumps 112 may be formed on the substrate during wire bonding. The wire bonding is accomplished, for example, using a ball stitch on ball (BSOB) technique, although other wire bonding techniques are possible. Examples of wire bonding techniques that can be used to create electrical connections between an image sensor and a substrate are described with reference to FIGS. 4A-4C. FIG. 4A depicts a "normal" bonding technique in which a ball bond 120 is used at the image sensor and a stitch bond 122 is used at the substrate. FIG. 4B depicts a "reverse" bonding technique in which a stitch bond 124 is used at the image sensor and a ball bond 126 is used at the substrate. FIG. 4C depicts the BSOB technique in which ball bonds 128 and 130 are used at both the image sensor and the substrate. Although some wire bonding techniques are described, other techniques can be used to create electrical connections between the image sensors and the substrate.

Figure 2D:
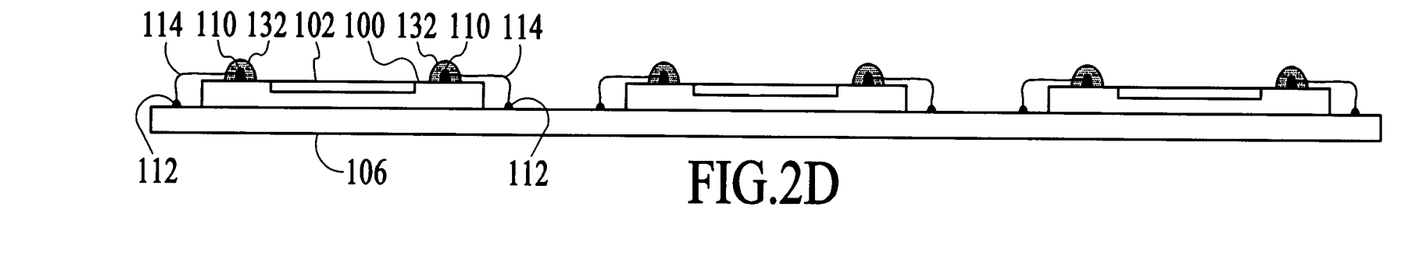
Figure 5:
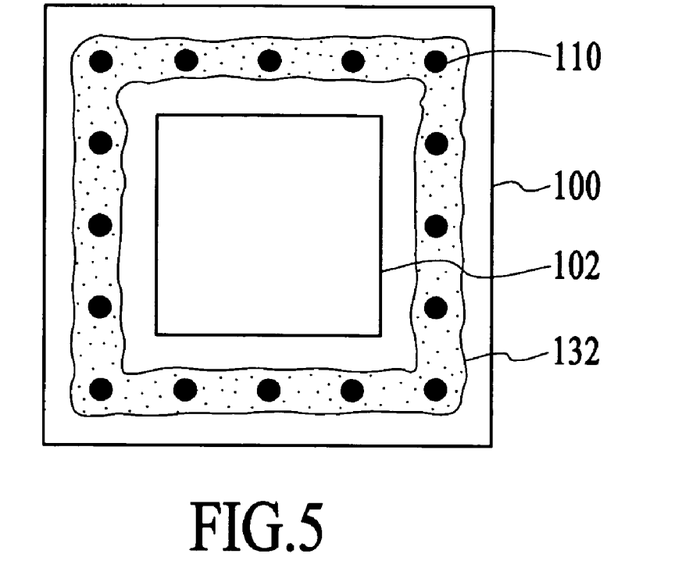
FIG. 5 depicts a top view of an image sensor with adhesive dispensed around the perimeter of the active area at the metallic bumps in a continuous trail that encircles the active area of the image sensor.

Once the wire bonding is complete, the next step is to glue a transparent cover to each of the image sensors. Referring to FIG. 2D, an adhesive 132 is dispensed on the image sensors 100. In the embodiment of FIG. 2D, the adhesive is dispensed around the perimeter of the active area 102 of the image sensors at the metallic bumps 110. In an embodiment, the adhesive is dispensed such that a continuous trail of adhesive encircles the active area of the image sensors. FIG. 5 depicts a top view of an image sensor with adhesive 132 dispensed around the perimeter of the active area at the metallic bumps in a continuous trail that encircles the active area of the image sensor.

Figure 2E:
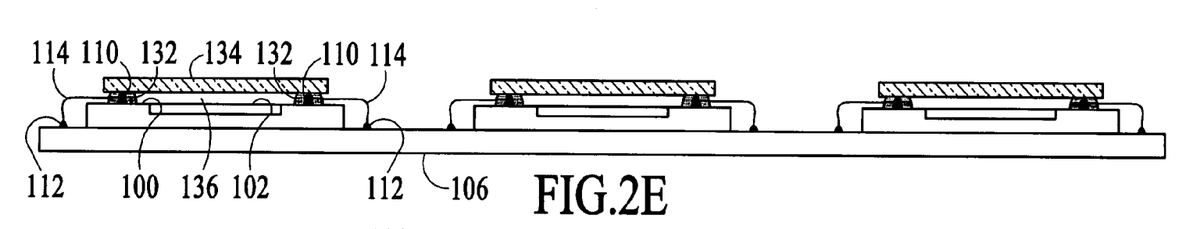

Once the adhesive 132 is dispensed around the perimeter of the active area 102 of the image sensors 100, transparent covers are placed in contact with the adhesive and the metallic bumps 110. FIG. 2E depicts transparent covers 134 placed in contact with the adhesive 132 and the metallic bumps 110. As depicted in FIG. 2E, the metallic bumps serve as supports and spacers for the transparent covers. That is, the metallic bumps provide structural support for the transparent covers to sit on while also setting the distance between the transparent covers and the image sensors. With uniform height metallic bumps, the transparent covers sit flush on top of the metallic bumps. After the transparent covers are placed in contact with the adhesive and the metallic bumps, the adhesive is cured to connect the transparent covers to the image sensors. The adhesive may be cured, for example, at room temperature, at an elevated temperature, or by applying UV light. Once the adhesive is cured, the active area of each image sensor is encapsulated within a cavity 136 that is formed by the image sensor, the metallic bumps, the transparent cover, and the adhesive.

Figure 2F:
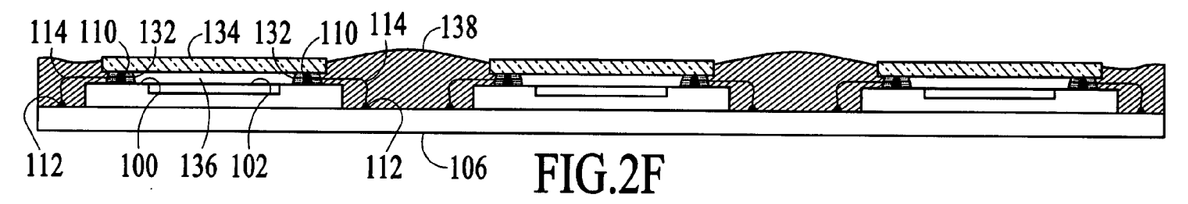

Once the adhesive 132 is cured, the electrical connections 114 between the image sensors 100 and the substrate 106 are protected by applying an epoxy 138 in the gaps between the image sensors as depicted in FIG. 2F. Once applied, the epoxy is cured into a solid which encapsulates the wire bonds 114. Although an epoxy is described, other materials may be used to fill in the gaps between the image sensors.

Figure 2G:
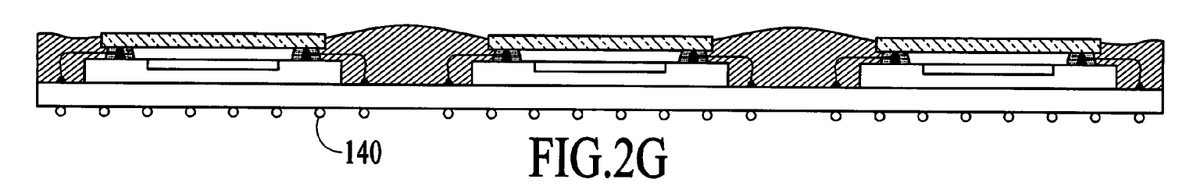

Once the epoxy 138 in the gaps between the image sensors 100 is cured, solder balls 140 are attached to the substrate 106 as depicted in FIG. 2G. In the embodiment of FIG. 2G, the solder balls are attached on the bottom side of the substrate so that the image sensor packages can be physically and electrically connected to other systems.

Figure 2H:
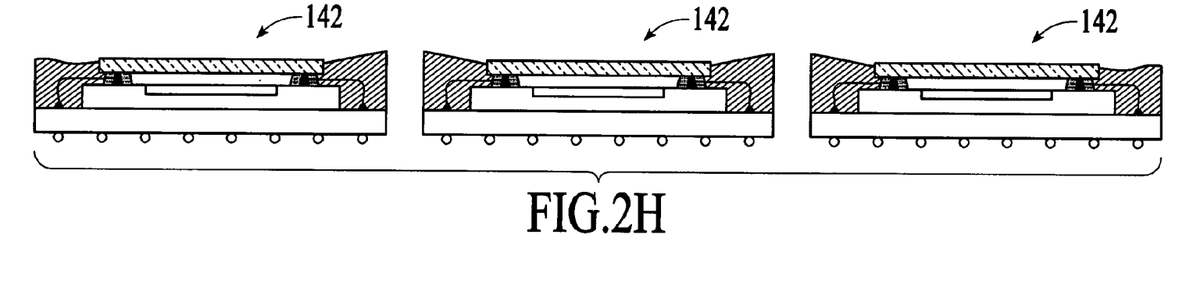

Once the solder balls 140 are attached to the substrate 106, the image sensor packages are separated or "singularized" into individually packaged image sensors. FIG. 2H depicts the three image sensors 100 from FIG. 2G after being separated from each other into three individually packaged image sensors 142. In an embodiment, the individually packaged image sensors are singularized by sawing between the devices.

Figure 6A:
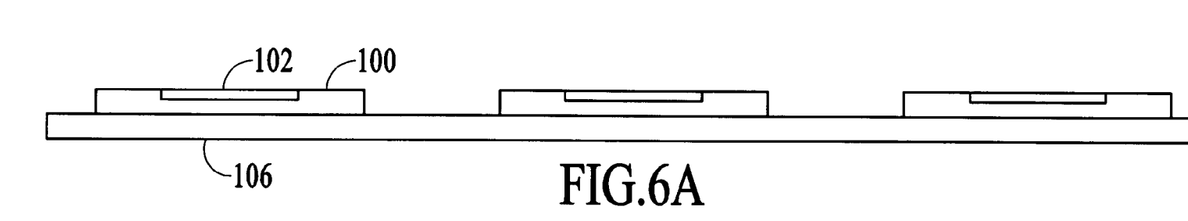
FIGS. 6A-6H depict steps in a method for packaging image sensors in accordance with an embodiment of the invention in which wire bonding is performed after the transparent covers are attached.

In the embodiment of FIGS. 2A-2H, wire bonding is performed before the transparent covers 134 are attached. FIGS. 6A-6H depict steps in a method for packaging image sensors in accordance with an embodiment of the invention in which wire bonding is performed after the transparent covers are attached. Referring to FIG. 6A, image sensors 100 as described above in FIGS. 1A and 1B are attached to a substrate 106.

Figure 6B:
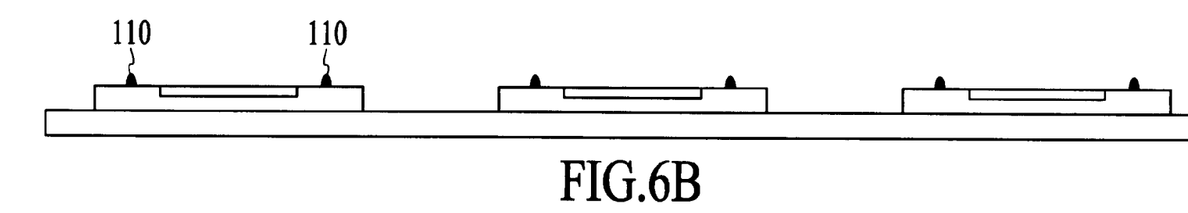

After the image sensors 100 are attached to the substrate 106, metallic bumps 110 are formed on the image sensors as depicted in FIG. 6B. In the embodiment of FIG. 6B, the metallic bumps have a uniform height and are formed in a pattern around the perimeter of the active area 102 of the image sensors. FIG. 3 depicts a top view of an image sensor 100 with an exemplary pattern of metallic bumps 110 formed around the perimeter of the active area 102 of the image sensor. In the exemplary method described with reference to FIGS. 6A-6H, the metallic bumps are not formed on bond pads of the image sensor. In particular, bond pads of the image sensors are left exposed so that one end of the bond wires can be attached to the bond pads.

Figure 6C:
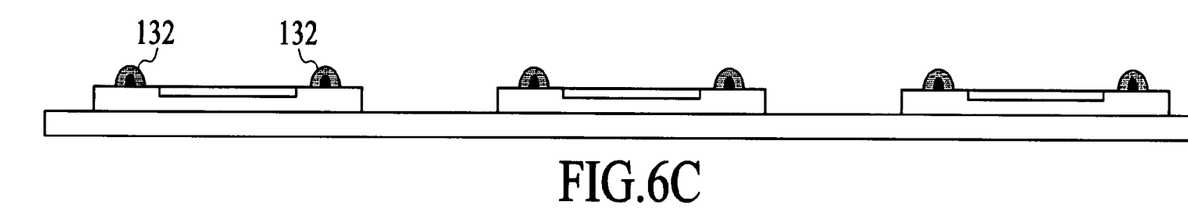

Once the metallic bumps 110 are formed on the image sensors and the substrate, the next step is to glue a transparent cover to each of the image sensors 100. Referring to FIG. 6C, an adhesive 132 is dispensed on the image sensors. In the embodiment of FIG. 6C, the adhesive is dispensed around the perimeter of the active area of the image sensors at the metallic bumps. In an embodiment, the adhesive is dispensed such that a continuous trail of adhesive encircles the active area 102 of the image sensors as depicted in FIG. 5.

Figure 6D:
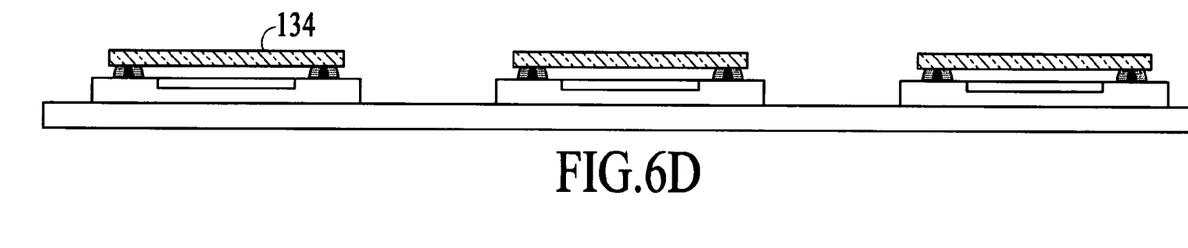

Once the adhesive is dispensed around the perimeter of the active area of the image sensors, transparent covers are placed in contact with the adhesive 132 and the metallic bumps 110. FIG. 6D depicts transparent covers 134 placed in contact with the adhesive and the metallic bumps. As depicted in FIG. 6D, the metallic bumps 110 serve as supports and spacers for the transparent covers. That is, the metallic bumps provide structural support for the transparent covers to sit on while also setting the distance between the transparent covers and the image sensors. With uniform height metallic bumps, the transparent covers sit flush on top of the metallic bumps. After the transparent covers are placed in contact with the adhesive 132 and the metallic bumps, the adhesive is cured. The adhesive may be cured, for example, at room temperature, at an elevated temperature, or by applying UV light. Once the adhesive is cured, the active area of each image sensor is encapsulated within a cavity 136 that is formed by the image sensor, the metallic bumps, the transparent cover, and the adhesive.

Figure 6E:
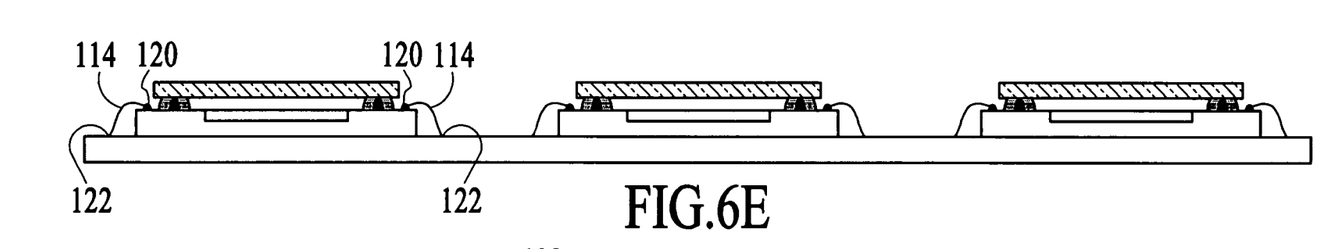

Once the transparent covers 134 are attached to the image sensors 100, electrical connections are created between the image sensors and the substrate 106 as depicted in FIG. 6E. In the embodiment of FIG. 6E, the electrical connections are formed via wire bonds 114 that are soldered between the substrate and the image sensor. The wire bonding is accomplished, for example, using normal bonding as described above with reference to FIG. 4A, although other wire bonding techniques are possible. Alternatively, other techniques can be used to create electrical connections between the image sensors and the substrate.

Figure 6F:
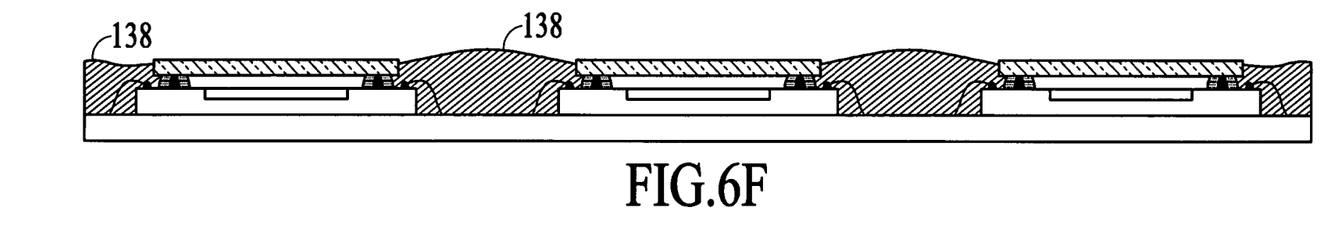

Once the wire bonding is complete, the electrical connections 114 between the image sensors 100 and the substrate 106 are protected by applying an epoxy 138 in the gaps between the image sensors as depicted in FIG. 6F. Once applied, the epoxy is cured into a solid, thereby encapsulating the electrical connections.

Figure 6G:
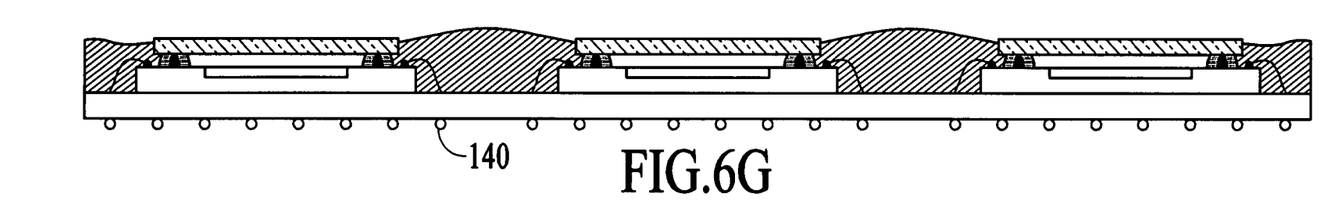

Once the epoxy 138 in the gaps between the image sensors 100 is cured, solder balls 140 are attached to the substrate 106 as depicted in FIG. 6G. In the embodiment of FIG. 6G, the solder balls are attached on the bottom side of the substrate so that the image sensor packages can be physically and electrically connected to other systems.

Figure 6H:
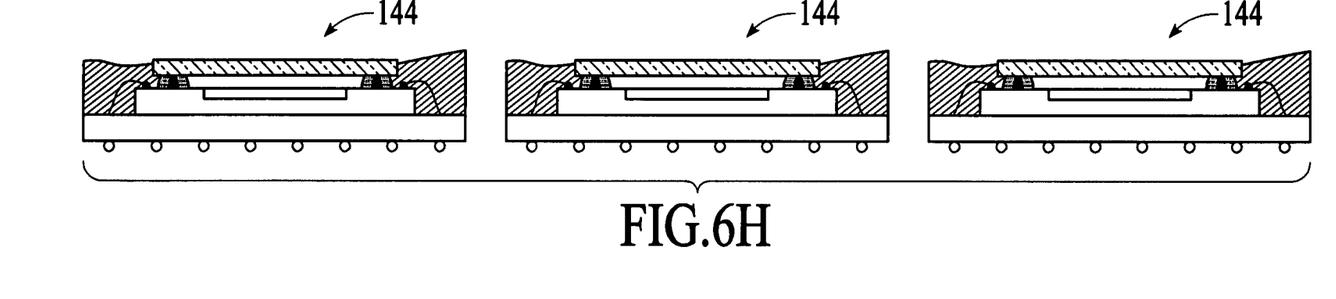

Once the solder balls 140 are attached to the substrate 106, the image sensor packages are separated or "singularized" into individually packaged image sensors. FIG. 6H depicts the three image sensors from FIG. 6G after being separated from each other into three individually packaged image sensors 144. In an embodiment, the individually packaged image sensors are singularized by sawing between the devices.

Figure 7A:
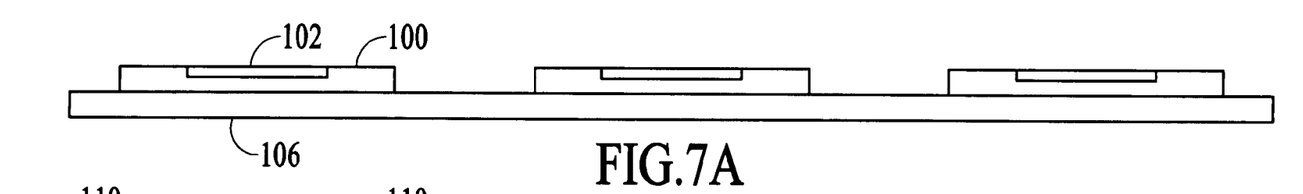
FIGS. 7A-7H depict steps in a method for packaging image sensors in accordance with an embodiment of the invention in which the metallic bumps are formed on the transparent cover instead of the image sensor.

In the embodiments of FIGS. 2A-2H and FIGS. 6A-6H, the metallic bumps 110 are formed on the image sensors 100. FIGS. 7A-7H depict steps in a method for packaging image sensors in accordance with an embodiment of the invention in which the metallic bumps are formed on the transparent cover 134 instead of the image sensor. Referring to FIG. 7A, image sensors 100 as described above in FIGS. 1A and 1B are attached to a substrate 106.

Figure 7B:
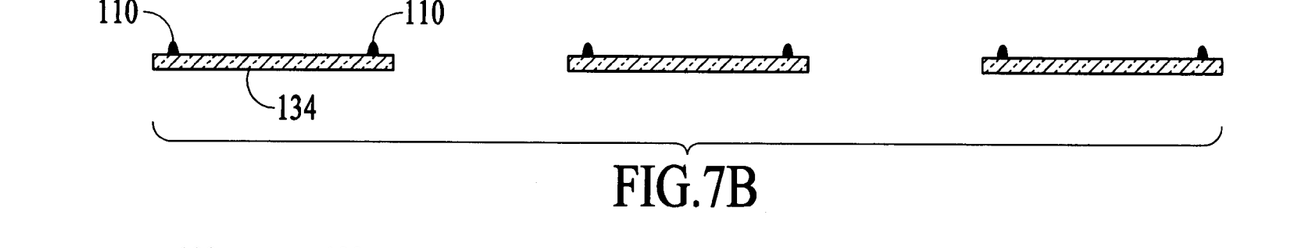
Figure 8:
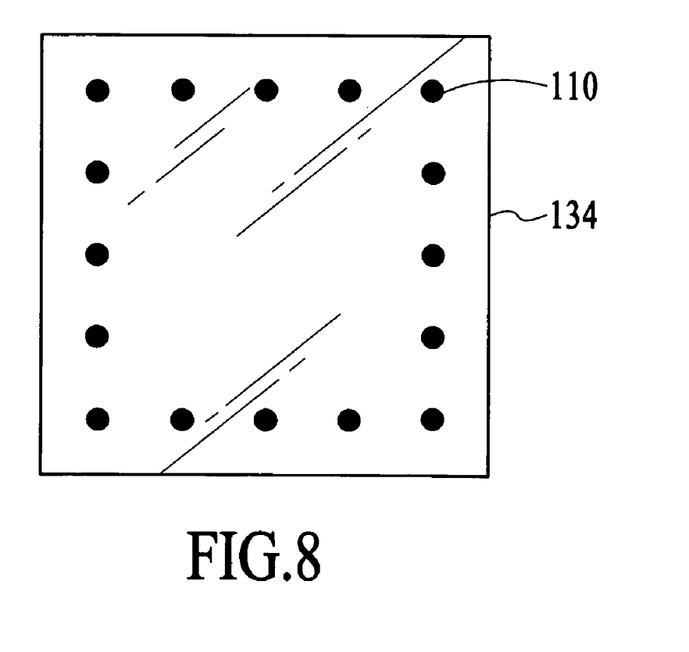
FIG. 8 depicts a top view of a transparent cover with an exemplary pattern of metallic bumps formed around the perimeter.

Separate from the step described with reference to FIG. 7A, metallic bumps 110 are formed on transparent covers 134. FIG. 7B depicts three transparent covers on which metallic bumps are formed. For example, the metallic bumps are formed on the transparent covers using wire bonding equipment. In an embodiment, the metallic bumps have a uniform height and are formed in a pattern that fits around the perimeter of the active area 102 of the corresponding image sensors 100. FIG. 8 depicts a top view of a transparent cover 134 with an exemplary pattern of metallic bumps 110 formed around the perimeter. In this example, the metallic bumps are configured to leave bond pads on the image sensor exposed. In an embodiment, the transparent covers can be connected to each other during the packaging process.

Figure 7C:
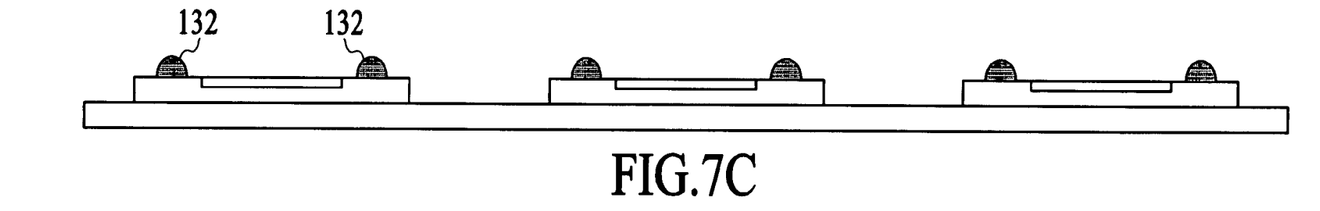

Once the image sensors 100 are attached to the substrate 106 and the metallic bumps 110 are formed on the transparent covers 134, the next step is to glue the transparent covers to the image sensors. Referring to FIG. 7C, an adhesive is dispensed on the image sensors. In the embodiment of FIG. 7C, the adhesive 132 is dispensed around the perimeter of the active area of each image sensor in a pattern that corresponds to the metallic bumps that are formed on the transparent covers. In an embodiment, the adhesive is dispensed such that a continuous trail of adhesive encircles the active area of the image sensors similar to that shown in FIG. 5 except without the metallic bumps. In an alternative embodiment, the adhesive is dispensed on the transparent cover at the metallic bumps instead of the image sensor.

Figure 7D:
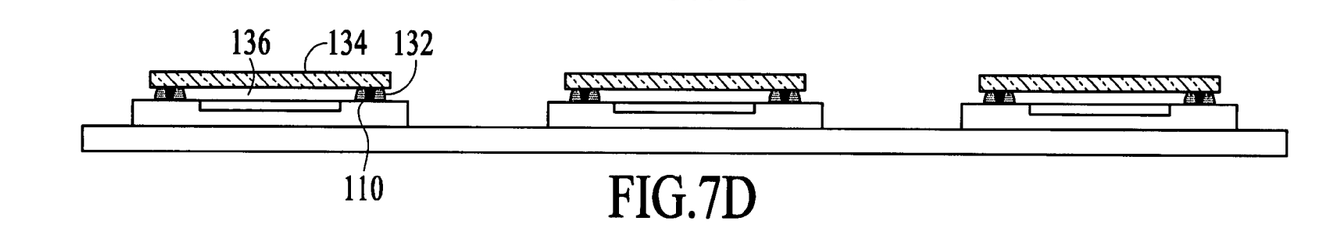

Once the adhesive 132 is dispensed around the perimeter of the active area 102 of the image sensors 100, the metallic bumps 110 of the transparent covers 134 shown in FIG. 7B are placed in contact with the adhesive and the image sensors. FIG. 7D depicts the metallic bumps 110 of the transparent covers placed in contact with the adhesive and the image sensors. As depicted in FIG. 7D, the metallic bumps serve as supports and spacers for the transparent covers. That is, the metallic bumps provide structural support for the transparent covers while also setting the distance between the transparent covers and the image sensors. With uniform height metallic bumps, the transparent covers sit flush on top of the metallic bumps. After the metallic bumps of the transparent covers are placed in contact with the adhesive and the image sensors, the adhesive is cured. The adhesive may be cured, for example, at room temperature, at an elevated temperature, or by applying UV light. Once the adhesive is cured, the active area 102 of each image sensor is encapsulated within a cavity 136 that is formed by the image sensor, the metallic bumps, the transparent cover, and the adhesive.

Figure 7E:
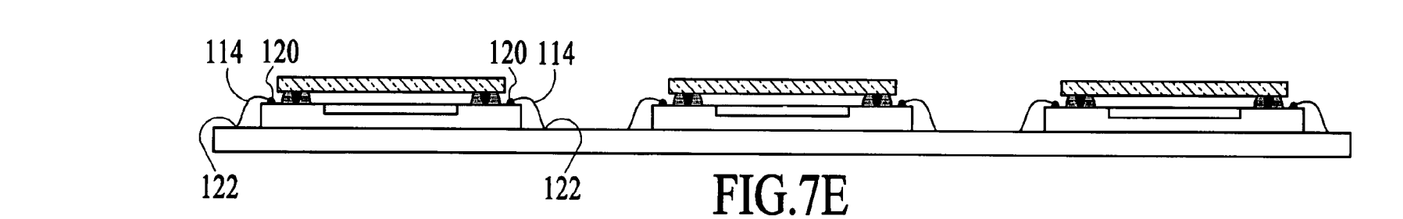

Once the transparent covers 134 are attached to the image sensors 100, electrical connections are created between the image sensors and the substrate 106 as depicted in FIG. 7E. In the embodiment of FIG. 7E, the electrical connections are formed via wire bonds 114 that are soldered between the substrate and the image sensor. The wire bonding is accomplished, for example, using normal bonding as described above with reference to FIG. 4A, although other wire bonding techniques are possible. Other techniques can be used to create electrical connections between the image sensors and the substrate.

Figure 7F:
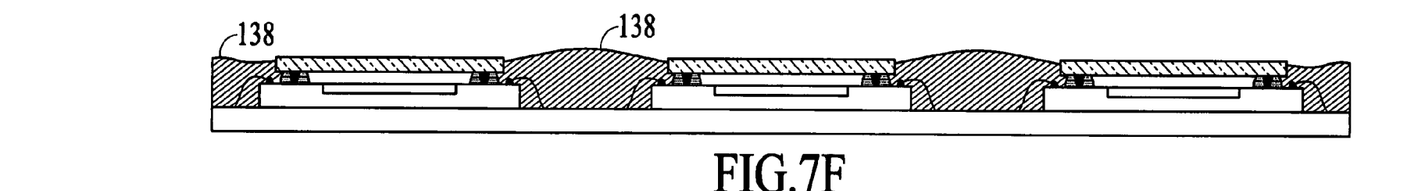

Once the wire bonding is complete, the electrical connections 114 between the image sensors 100 and the substrate 106 are protected by applying an epoxy 138 in the gaps between the image sensors as depicted in FIG. 7F. Once applied, the epoxy in the gaps between the image sensors is cured into a solid.

Figure 7G:
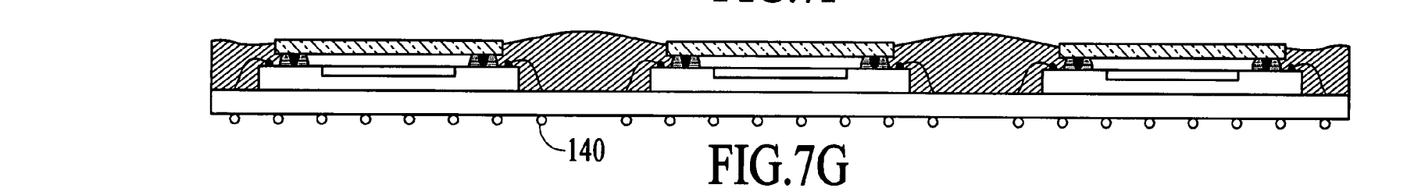

Once the epoxy 138 in the gaps between the image sensors is cured, solder balls 140 are attached to the substrate as depicted in FIG. 7G. In the embodiment of FIG. 7G, the solder balls are attached on the bottom side of the substrate so that the image sensor packages can be physically and electrically connected to other systems.

Figure 7H:
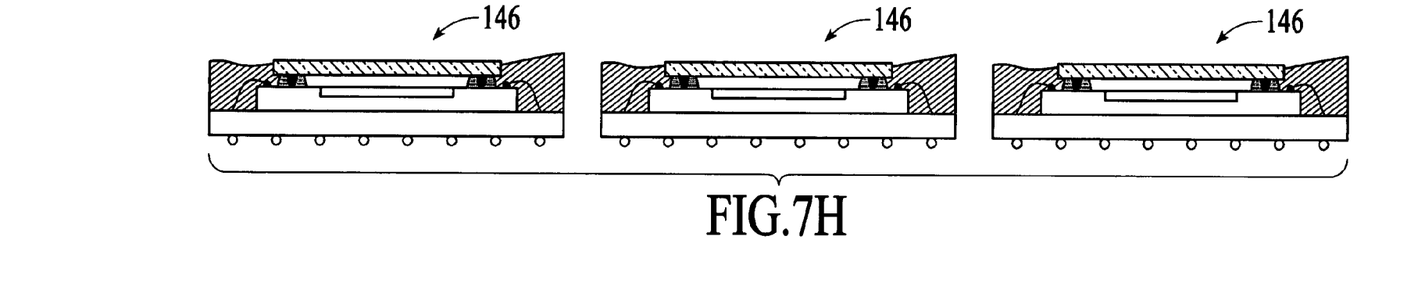

Once the solder balls 140 are attached to the substrate 106, the image sensor packages are separated or "singularized" into individually packaged image sensors 146. FIG. 7H depicts the three image sensors from FIG. 7G after being separated from each other into three individually packaged image sensors 146. In an embodiment, the individually packaged image sensors are singularized by sawing between the devices.

Using the above-described packaging techniques, singulation can be achieved by sawing with a conventional saw street width. The conventional saw street width enables the number of image sensors per substrate to be maintained.

Figure 9:
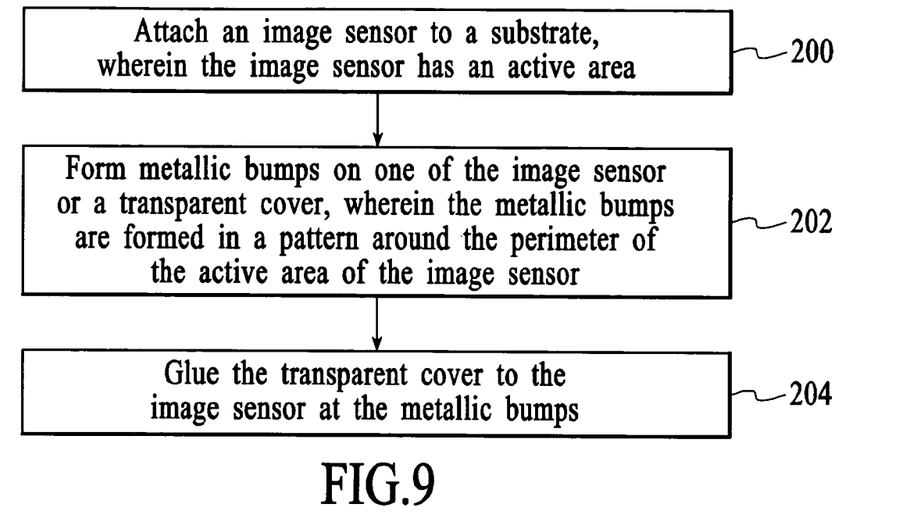
FIG. 9 depicts a process flow diagram of a method for packaging an image sensor.

FIG. 9 depicts a process flow diagram of a method for packaging an image sensor. At block 200, an image sensor is attached to a substrate, wherein the image sensor has an active area. At block 202, metallic bumps are formed on one of the image sensor or a transparent cover, wherein the metallic bumps are formed in a pattern around the perimeter of the active area of the image sensor. At block 204, the transparent cover is glued to the image sensor at the metallic bumps.

Figure 10:
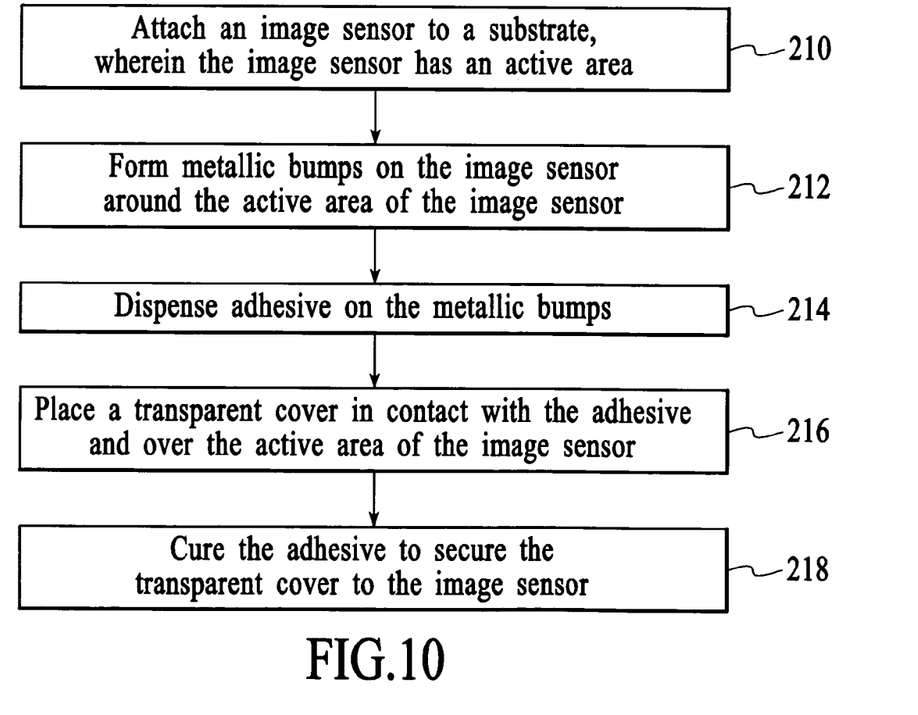
FIG. 10 depicts a process flow diagram of a method for packaging an image sensor.

FIG. 10 depicts a process flow diagram of a method for packaging an image sensor. At block 210, an image sensor is attached to a substrate, wherein the image sensor has an active area. At block 212, metallic bumps are formed on the image sensor around the active area of the image sensor. At block 214, adhesive is dispensed on the metallic bumps. At block 216, a transparent cover is placed in contact with the adhesive and over the active area of the image sensor. At block 218, the adhesive is cured to secure the transparent cover to the image sensor.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A packaged image sensor comprising:
a substrate;
an image sensor attached to the substrate, wherein the image sensor has an active area;
electrical connections between the image sensor and the substrate;
a transparent cover large enough to cover the active area of the image sensor;
metallic bumps between the image sensor and the transparent cover in a pattern around the perimeter of the active area of the image sensor; and
adhesive between the image sensor and the transparent cover around the perimeter of the active area in a pattern that corresponds to the metallic bumps, wherein the adhesive connects the transparent cover and the image sensor such that the metallic bumps contact both the transparent cover and the image sensor.

2. The packaged image sensor of claim 1 wherein the image sensor, the transparent cover, the metallic bumps, and the adhesive encapsulate the active area of the image sensor.

3. The packaged image sensor of claim 2 further including epoxy formed over the electrical connections to encapsulate the electrical connections.

4. The packaged image sensor of claim 1 wherein the metallic bumps are formed on the image sensor.

5. The packaged images sensor of claim 4 wherein the metallic bumps are formed on bond pads of the image sensor.

6. The packaged image sensor of claim 4, wherein the metallic bumps are formed on the image sensor separate from bond pads of the image sensor.

7. The packaged image sensor of claim 4, wherein the transparent cover sits flush on top of the metallic bumps.

8. The packaged image sensor of claim 1 wherein the metallic bumps are formed on the transparent cover.

* * * * *